310-10 SR
FIP8502 XR 3,522,494

INVENTOR.
GERRIT BOSCH
BY
[signature]
AGENT

Aug. 4, 1970 G. BOSCH 3,522,494

HALL ELEMENT

Filed Sept. 5, 1968 3 Sheets-Sheet 2

INVENTOR.
GERRIT BOSCH

BY

Frank R. Trifari

AGENT

HALL ELEMENT

Filed Sept. 5, 1968 3 Sheets-Sheet 3

GERRIT BOSCH INVENTOR.

BY

AGENT

United States Patent Office 3,522,494

Patented Aug. 4, 1970

3,522,494

HALL ELEMENT

Gerrit Bosch, Emmasingel, Eindhoven, Netherlands, assignor, by mesne assignments, to U.S. Philips Corporation, New York, N.Y., a corporation of Delaware

Filed Sept. 5, 1968, Ser. No. 757,612
Claims priority, application Netherlands, Sept. 8, 1967, 6712327
Int. Cl. H01l *11/00, 15/80*
U.S. Cl. 317—235 8 Claims

ABSTRACT OF THE DISCLOSURE

A semiconductive Hall element of silicon comprising a single crystal substrate having an epitaxial layer, a junction being formed at the interface. The epitaxial layer is provided with an annular region of opposite type conductivity forming a boundary p-n junction defining an island constituting the Hall element. An insulating layer is on the surface. Through openings in the insulating layer are extended contacts to the island for conveying current through the Hall element and for deriving a Hall signal. Solid state amplifiers can be incorporated in other islands of the silicon crystal for amplification of the Hall signal.

The invention relates to a Hall element having a semiconductor body of one conductivity type in the form of a layer which is provided with two contacts to convey a current through the semiconductor body in a lateral direction and with at least one further contact for deriving electric Hall signals which can be produced in a lateral direction at right angles to the said direction of the current by means of a magnetic field. Such Hall elements are marketed with or without a device for producing the magnetic field.

For Hall elements, semiconductor bodies are usually used having a large mobility of the free charge carriers, for example, indium antimonide, or indium arsenide, since, for example the Hall voltage is proportional to the mobility of the free charge carriers, and furthermore semiconductor bodies can be given a small thickness to restrict the current consumption. Silicon as a material for a Hall element is generally considered to be impractical in view of the comparatively small mobility of the free charge carriers in silicon. This is an important reason for the fact that up till now Hall elements have not been integrated in monolithic silicon circuits.

A further reason for this latter is that the Hall effect is generally considered as an intrinsic material property in which the semiconductor body of the Hall element would have to satisfy conditions inter alia regarding the doping and the dimensions, which cannot be realized in monolithic silicon circuits.

It has already been proposed to use the channel region of a silicon M.I.S. (Metal Insulating Layer Semiconductor) transistor as a semiconductor body for a Hall element. This solution is said to have the advantage that M.I.S. transistors can be incorporated in a monolithic circuit in a readily insulated form while the material properties in the channel region can be influenced by means of the gate electrode. Nevertheless such a M.I.S. Hall element does not provide a satisfactory operation. An important drawback is that an extra electrode, namely the gate electrode, is required while in addition due to the low thickness of the channel region, the surface properties of the semiconductor body exert disadvantageous influence. Moreover, to amplify the Hall signals only an M.I.S. transistor can be connected to the M.I.S.-Hall element and no bipolar npn or pnp-transistor.

The invention is inter alia based on the recognition of the fact that the above described considerations on the basis of which Hall elements have so far not been integrated in monolithic silicon circuits and on the basis of which even a complicated M.I.S.-Hall element has been manufactured, is not entirely correct and that Hall-elements can just be manufactured in a particularly simple manner from silicon having properties which are comparable to those of conventional Hall elements having a semiconductor body consisting of an $A_{III}B_V$ compound, for example, indium antimonide and indium arsenide, and which can be incorporated wthout difficulies and readily insulated in a monolithic silicon circuit.

The invention is furthermore based on the surprising recognition of the fact that in contrast with what is generally assumed, the semiconductor body of such a Hall element of silicon may simply consist of an epitaxial layer, or a part thereof, of a starting body conventionally used in the manufacture of monolithic silicon circuits and consisting of a silicon substrate provided with an epitaxial silicon layer. Such conventional starting bodies usually consist of an epitaxial layer of one conductivity type and a substrate of the opposite conductivity type. In addition, the epitaxial layer usually is of the n-type and the substrate of the p-type conductivity which is favorable since the mobility of electrons in silicon is considerably larger than the mobility of holes.

The recognitions on which the invention is based will now be described in greater detail.

The Hall voltage $V_H$ which can be obtained with a Hall-element is determined by $$V_H = K\mu B V_{input} = K\mu BiR$$

wherein K is a function of the lengthwidth ratio of the Hall-body and maximally equal to approximately 0.7$\mu$ is the mobility of the free charge carriers, B the magnetic induction of the magnetic field; $V_{input}$ is the voltage which is applied to the input terminals *i* the current between the input terminals and R the resistance of the semiconductor body. In connection with the large mobility of the free electrons in materials such as indium antimonide and indium antimonide and indium arsenside larger, and Hall approximately 30,000 cm.$^2$/volt sec. respectively, against approximately 1500 cm.$^2$/volt. sec. in silicon, said materials are preferably used in Hall elements.

It is difficult to make the resistance of the materials indium antimonide and indium arsenside large,and Hall plates of these materials in practice often have a resistance of at most a few ohms.

In circuit arrangements in which Hall elements are to be incorporated, an input voltage $V_{input}$ of a few volts is often available; such an input voltage would mean a dissipation of a few watts in the Hall plate so that the Hall plate would be destroyed by overheating. Therefore, in practice, a very much smaller input voltage is to be used. Thus the admissible dissipation, that is to say the admissible input power $$V_{input} = i^2R = \frac{V^2_{input}}{R}$$

is a restricting factor.

In a Hall body of silicon, a dissipation equal to the maximum admissible dissipation in a Hall body of, for example, indium antimonide is certainly admissible. When comparing Hall elements having a silicon body with those having an indium antimonide body, in which the admissible dissipations are assumed to be equal, it may be seen in the following manner what conditions the silicon body has to fulfill to enable a Hall voltage which is comparable to that which can be obtained with an indium antimonide body.

A Hall body with indium antimonide in practice is very thin so as to obtain a useful resistance for the Hall body in which not too large input currents occur. This means that surface phenomena play an important part and in practice the mobility of the free electrons therefore is not 70,000 cm.$^2$/v. sec. but only approximately 35,000 cm.$^2$/v. sec.

The technology of silicon can much better be controlled, so that in thin silicon layers, for example, having a thickness of approximately 10 microns a mobility of electrons of 1500 cm.$^2$/v. sec. is possible.

So in practice indium antimonide is only approximately a factor 20 better than silicon as regards the mobility of the free electrons.

Epitaxial layers as they are frequently used in starting silicon bodies for manufacturing integrated silicon circuits often have a thickness of approximately 10 microns and a resistivity of approximately 0.1 ohm. cm. to a few ohm-cm. and thus a sheet resistance of approximately 100 to a few thousands of ohms. A Hall body consisting of such an epitauial layer or part thereof can hence easily have a resistance of approximately 0.5K ohm, that is to say a resistance which is at least a hundred times larger than the said Hall bodies of indium antimonide.

This means that for such a Hall body of silicon an approximately 10 times larger input voltage is admissible with the same dissipation than for a Hall body of indium antimonide and this substantially removes the advantage of indium antimonide over silicon.

From the above it is obvious that with a Hall body consisting of an epitaxial silicon layer a Hall voltage can be obtained which is comparable to that which can be obtained with a Hall body of indium antimonide, in which an epitaxial layer as is usual in the manufacture of monolithic silicon circuits can be used and hence no special silicon bodies need be manufactured. Moreover, no practical objectionably large input voltages are necessary, and insulated integration in a monolithic circuit arrangement is possible without any objection.

In the use of dry cell batteries, increasing nowadays, a low current consumption is often desirable. When again a Hall element of silicon is compared with a Hall element of indium antimonide, in which the mobility of electrons of indium antimonide again is 20 times larger than that of silicon, but the resistance of the silicon body is 100 times larger than that of the indium antimonide body, while the same Hall voltage is produced with both elements, it is found from the formula $V_H = K\mu BiR$ that the current consumption of the Hall element of silicon is one-fifth of that of the Hall element of indium antimonide.

The maximum output current of a Hall element of silicon also is smaller but in many cases the Hall signals have nevertheless to be amplified while a Hall element of silicon according to the invention can easily be integrated with an amplifier circuit.

Nowadays Hall elements are known having a very thin body consisting of an $A_{III}B_V$-compound, for example, consisting of indium antimonide. These bodies may have a resistance of approximately 30 ohm, but the mobility of electrons in such thin layers is only approximately 10,000 cm.$^2$/v. sec. so that the advantages of such Hall elements relative to the above mentioned known Hall elements are comparatively small. The possibility of integration in the monolithic silicon circuit will also be of a considerably greater importance. In addition a Hall element of silicon is considerably less dependent upon temperature than a Hall element of indium antimonide or indium arsenide.

It is the object of the invention to provide a simple, readily operating Hall element of silicon, which can simply be manufactured and is particularly suitable for being included in monolithic silicon circuits.

According to the invention, a Hall element of the type mentioned in the preamble is characterized in that the semiconductor body consists of at least a part of an epitaxial silicon layer of one conductivity type, which epitaxial layer is provided on a silicon substrate of the opposite conductivity type, the epitaxial layer comprising regions of the opposite conductivity type which extend throughout the thickness of the epitaxial layer, so that said layer comprises at least one part of one conductivity type, termed island, which is bounded by the said regions, while the semiconductor body of the Hall element consists of this island, the epitaxial layer being covered by an insulating layer on which conductors are provided which are connected to the island through apertures in the insulating layers. This structure according to the invention is of importance for monolithic integrated circuits in connection with the mutual electric insulation of the elements. But also when no further elements are present and the epitaxial layer only forms part of the Hall body, said Hall body may advantageously consist of an island, since in that case the pn-junction bounding the Hall body, emerges only below the insulating layer at the surface of the silicon body consisting of the epitaxial layer and the substract, so that the possibility of leakage current through the pn-junction is reduced.

The epitaxial layer and the substrate preferably have a thickness and a doping which are conventional in manufacturing integrated circuits for semiconductor starting bodies consisting of a silicon substrate provided with an epitaxial silicon layer.

The invention is of particular importance for use in integrated circuits, and an important embodiment of a Hall element according to the invention is therefore characterized in that the semiconductor body consists only of a part of the epitaxial layer while the epitaxial layer furthermore forms part of at least one further semiconductor circuit element.

Such further semiconductor circuit elements may be for example, transistors, diodes, resistors and capacitances.

In many important uses a circuit arrangement is for amplifying the electric Hall signals is desirable, inter alia when using Hall elements in commutator-less electric motors, in which the currents through the coils are switched by means of Hall elements. The invention is of particular advantage especially for this type of application. An important embodiment of a Hall element according to the invention is therefore characterized in that the further semiconductor elements with their connections form a circuit arrangement for amplifying the electric Hall signals to be produced. Hall elements may advantageously be used for controlling the amplification of a circuit for amplifying electric signals. In this case the Hall signals are not amplified, they are used for controlling a circuit. In such circuit arrangements also the possibility of integration is very important and a further preferred embodiment of a Hall element according to the invention is characterized in that the further semiconductor circuit elements with their mutual electric connections form a circuit for amplifying electric signals the amplification of which can be controlled by means of the Hall signals to be produced.

It may be of importance that the current consumption be very low in which a semiconductor body is desirable which is thinner than the epitaxial layer. A preferred embodiment of a Hall element according to the invention is therefore characterized in that the epitaxial layer comprises a surface region of the opposite conductivity type, the semiconductor body of the Hall element being located, at least over a large part of its surface area, between said surface region and the substrate.

Another preferred embodiment is characterized in that a buried layer of the opposite conductivity type is provided in the epitaxial layer and adjoins the substrate, the semiconductor body of the Hall element extending at least for the greater part above said buried layer.

The invention furthermore relates to a brushless electric motor, in which the current through the coil(s) is switched by means of at least one Hall element by the magnetic field of the rotor which motor is characterized in that a Hall element according to the invention is used.

The invention is of particular importance for such brushless electric motors, since Hall elements according to the invention can be manufactured cheaply and accurately by means of conventional planar methods, while amplifier circuits and/or electronic switches can form a monolithic circuit with the Hall element and can hence be incorporated as one component.

In order that the invention may be readily carried into effect, it will now be described in greater detail, by way of example, with reference to a few figures and the drawing, in which:

FIG. 1 diagrammatically shows a plan view of an example of a Hall element according to the invention, of which FIG. 2 is a cross-sectional view taken on the line II—II in FIG. 1.

FIG. 3 is a diagrammatic plan view of an example of a Hall element according to the invention in the form of a monolithic circuit, of which

FIG. 6 is a diagrammatic plan view of another example of a Hall element according to the invention in the form of a monolithic circuit, of which

Figure 1:
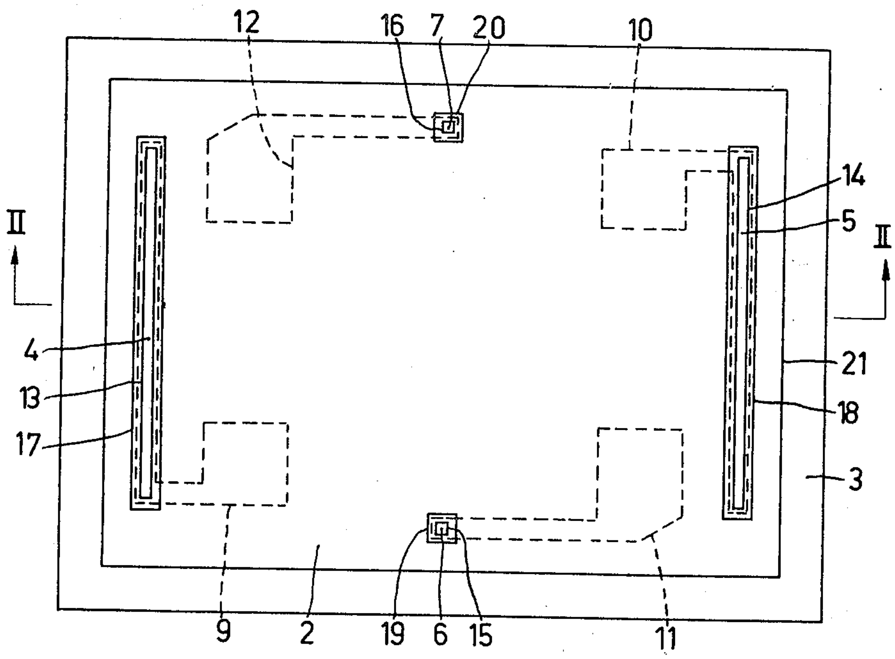
Figure 2:
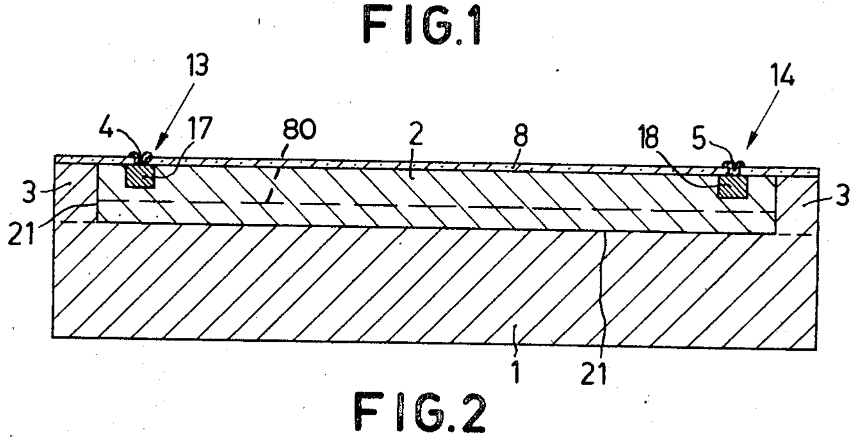

The Hall element shown in FIGS. 1 and 2 comprises a semiconductor body 2 of one conductivity type in the form of a layer which is provided with two connection contacts 4 and 5 to convey a current through the semiconductor body in a lateral direction and with two connection contacts 6 and 7 for deriving electric Hall signals which can be produced in a lateral direction at right angles to the said direction by means of a magnetic field. The magnetic field should have at least one component at right angles to the plane of the drawing in FIG. 1.

Devices for producing the magnetic field are not shown in the drawing but they may be of any conventional type.

According to the invention the semiconductor body consists at least of a part, in the present example of a part 2, of an epitaxial layer 2, 3 of one conductivity type which is provided on the silicon substrate 1 of the opposite conductivity type.

It is possible that the epitaxial layer as a whole forms the semiconductor body of the Hall element. In the present example, however, the epitaxial layer 2, 3 comprises regions 3 of the opposite conductivity type which extend throughout the thickness of the epitaxial layer 2, 3 so that said layer comprises a part 2 of one conductivity type, termed island, bounded by the regions 3, while the semiconductor body of the Hall element consists of the island 2. An insulating layer 8 covers the epitaxial layer 2, 3 while on said layer 8 conductors 9, 10, 11, 12 are provided which are contacted with the semiconductor body 2 of the Hall element through apertures 13, 14, 15 and 16 in the insulating layer 8 where said conductors form the connection contacts 4, 5, 6 and 7. In order to improve the contacting with the connection contacts 4 5, 6 and 7, the low-ohmic circuit regions 17, 18, 19 and 20 of one conductivity type are provided in the island 2.

It is to be noted that the insulating layer 8 in FIG. 1 is assumed to be transparent so that the underlying regions in the epitaxial layer 2, 3 are visible. The conductors 9, 10, 11 and 12 provided on the insulating layer 8 are shown in broken lines in FIG. 1.

The pn-junction 21 surrounds the island 2 and emerges at the surface of the body consisting of the substrate 1 and the epitaxial layer 2, 3 only below the insulating layer 8 so that the possibility of leakage currents through the junction 21 is small.

The substrate 1 and the epitaxial layer 2, 3 have a thickness and a doping which are conventional in manufacturing monolithic silicon circuits for semiconductor starting bodies, which consist of a silicon substrate provided with an epitaxial layer.

The manufacture of the described Hall element according to the invention is particularly simple. Starting material is a semiconductor body of a type which is commonly used in manufacturing integrated silicon circuits, for example, having a p-type substrate, thickness approximately 200 microns, and a resistivity of approximately 2 ohms-cm on which an n-type epitaxial layer, thickness approximately 10 microns, resistivity approximately 0.5 ohm-cm, is provided. In such a starting semiconductor body a large number of Hall elements according to the invention can simultaneously be provided. The separate elements are obtained subdividing the starting body.

First the epitaxial layer is divided into a number of n-type islands 2, dimensions approximately 1000 x 50 microns, by providiving p-type regions of the opposite conductivity type. This may be carried out in a manner commonly used in manufacturing monolithic circuits by diffusion of an impurity and by means of photoresist methods.

The low-ohmic n-type regions 17, 18, 19 and 20 are then provided in a conventional manner, for example, in the same manner in which diffused emitter regions of planar npn-transistors are provided. The regions 17 and 18 have dimensions, for example, of 25 x 400 x 2 microns and the regions 19 and 20 of 25 x 25 x 2 microns (the thickness of these regions is 2 microns).

The insulating layer 8 which may consist, for example, of silicon oxide or silicon nitride and has a thickness, for example, of 0.5 micron, is also provided in a conventional manner.

The apertures 13, 14, 15 and 16 are then provided in the layer 8 and the connection contacts 4, 5, 6 and 7 and the conductors 9, 10, 11 and 12 are provided by means of conventional photoresist and etching methods. The connection contacts 4, 5, 6 and 7 with the conductors 9, 10, 11 and 12 may consist of deposited aluminum.

The starting body may now be subdivided through planes which extend through the p-type regions and at right angles to the large surfaces of the starting body, so that the Hall elements are shown in FIGS. 1 and 2 are obtained.

Connection conductors may be connected in any conventional manner to the conductors 9, 10, 11 and 12, while the element may be incorporated in a suitable envelope, means being present for concentrating a magnetic field on the island 2.

Per ma. of input current and per Gauss of the magnetic field a Hall voltage of approximately 5 $\mu$v. can be obtained with the described Hall element.

The Hall element according to the invention consists of a homogeneously doped part of a conventional epitaxial layer. This has great advantages with respect to the use of a diffused region as a semiconductor body of a Hall element. A diffused region has an inhomogeneous doping and as a result of this an inhomogeneous current distribution would occur in which the largest current density would occur near the surface, where exactly the mobility of charge carriers is smallest due to the high doping. Furthermore a diffused region provided in an epitaxial layer has a higher doping than the epitaxial layer while the mobility of charge carrier decreases with higher dopings. Furthermore the conventional epitaxial layers are n-type conductive and p-type conductivity would be used for the diffused region to be able to insulate the region from is surroundings. However, the mobility of holes in silicon is much smaller than the mobility of electrons.

Figure 3:
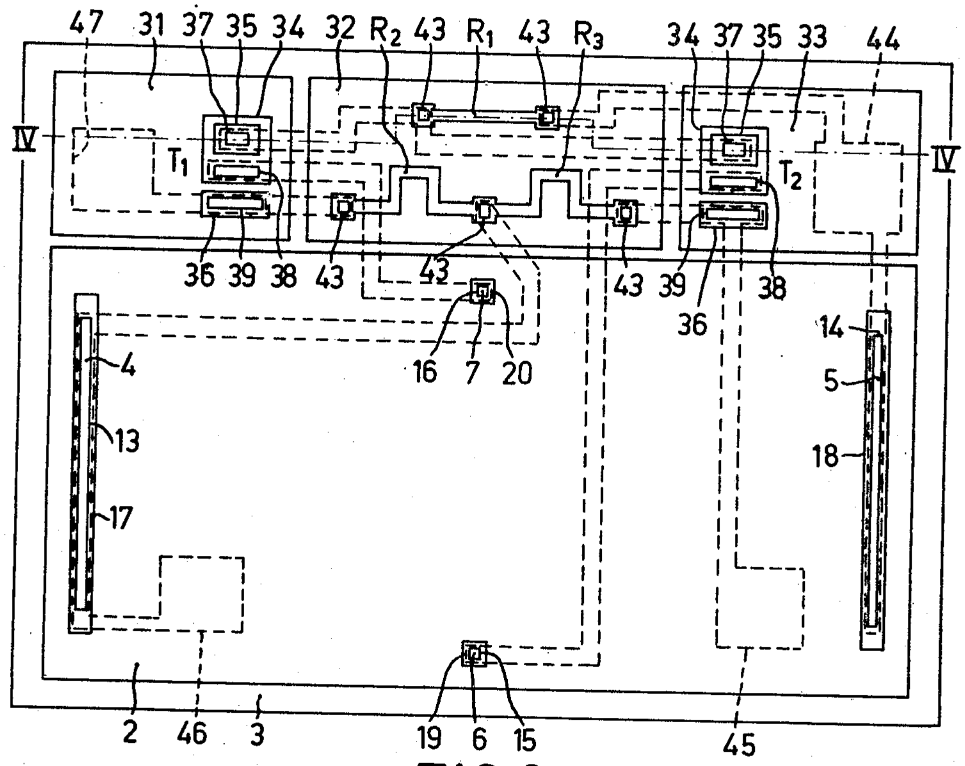
Figure 4:
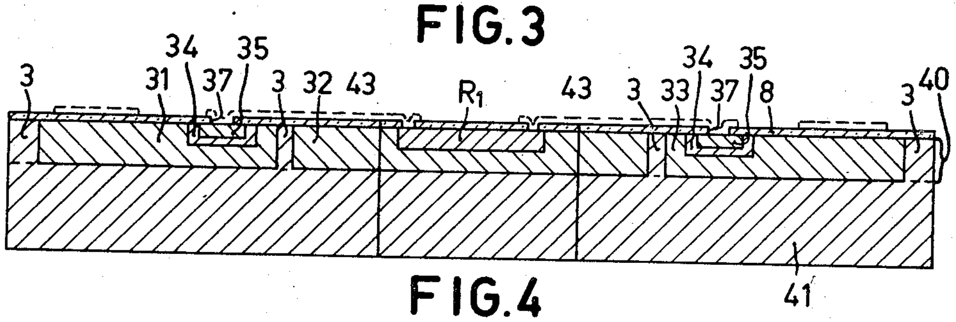
FIG. 4 is a diagrammatic cross-sectional view taken on the line IV—IV of FIG. 3, and FIG. 5 the circuit diagram.

FIGS. 3 and 4 show a Hall element according to the invention in which the semiconductor body of the Hall element consists only of a part of the epitaxial layer 40, while the epitaxial layer 40 furthermore forms part of further circuit elements which will be described below.

The epitaxial n-type layer 40 of silicon is provided on the p-type substrate 41 of silicon. The epitaxial layer 40 is divided in the n-type islands 2, 31, 32, 33 by the p-type regions 3 extending throughout the thickness of the layer 40.

The island 2 is the semiconductor body of the Hall element which further corresponds to the Hall element shown in FIGS. 1 and 2, and for which the same reference numerals are used. The doping and the thickness of the epitaxial layer and the substrate are therefore also the same as in the preceding example.

An insulating layer 8, for example of silicon oxide, thickness, for example, 0.5 micron, is provided on the epitaxial layer 40. In FIG. 3, this layer 8 is assumed to be transparent so that the underlying regions are visible. The conductors provided on the layer 8 are denoted by broken lines.

The connection contacts 4, 5, 6 and 7 of the Hall body 2 are formed by these conductors in the apertures 13, 14, 15 and 16 of the insulating layer 8.

The islands 31 and 33 comprise transistors T1 and T2, respectively, the islands of which themselves form the collector regions. The diffused p-type regions 34 having a thickness of approximately 3 microns and further proportions of approximately 70 x 70 microns are the base regions and the diffused n-type regions 35, thickness approximately 2 microns and further dimensions of approximately 50 x 30 microns are the emitter regions. The diffused n-type regions 36 which can be provided simultaneously with the emitter regions 35 and the regions 17, 18, 19 and 20 serve to enable a better contact between the collector regions and the conductors.

The conductors shown in broken lines are connected through the apertures 37, 38 and 39 to the emitter regions 35, the base regions 34 and the collector regions 31 and 33, respectively, of the transistors T1 and T2.

The resistors R1, R2 and R3 consisting of a p-type diffused regions are provided in the islands 32. These regions may be provided simultaneously with the base regions 34 and may have the same thickness as these base regions. The length and width of the regions may be chosen in connection with the desired value of the resistors R1, R2 and R3. The conductors are connected to the resistors R1, R2 and R3 through the apertures 43 in the insulating layer 8.

Connection conductors may be connected to the parts 44, 45, 46 and 47 of the conductors shown in broken lines. These parts have dimensions of, for example, 100 x 100 microns. The conductors may consist of deposited aluminum.

Figure 5:
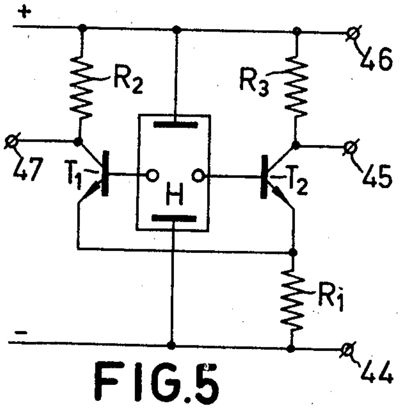

FIG. 5 shows the circuit diagram of the monolithic circuit shown in FIGS. 3 and 4. The Hall element is denoted by H. An input voltage is applied between the terminals 44 and 46. The electric Hall signals are amplified by the transistors T1 and T2 and may be derived between the terminals 47 and 46 and between the terminals 45 and 46.

The further circuit elements $T_1$, $T_2$, $R_1$, $R_2$, and $R_3$ with their conductive connections shown in broken lines form a circuit for amplifying the electric Hall signals to be produced.

The monolithic circuit shown in FIGS. 3 and 4 may be manufactured entirely by means of methods commonly used in the technology of manufacturing monolithic silicon circuits, for example, diffusion methods and photoresist and etching methods.

Figure 6:
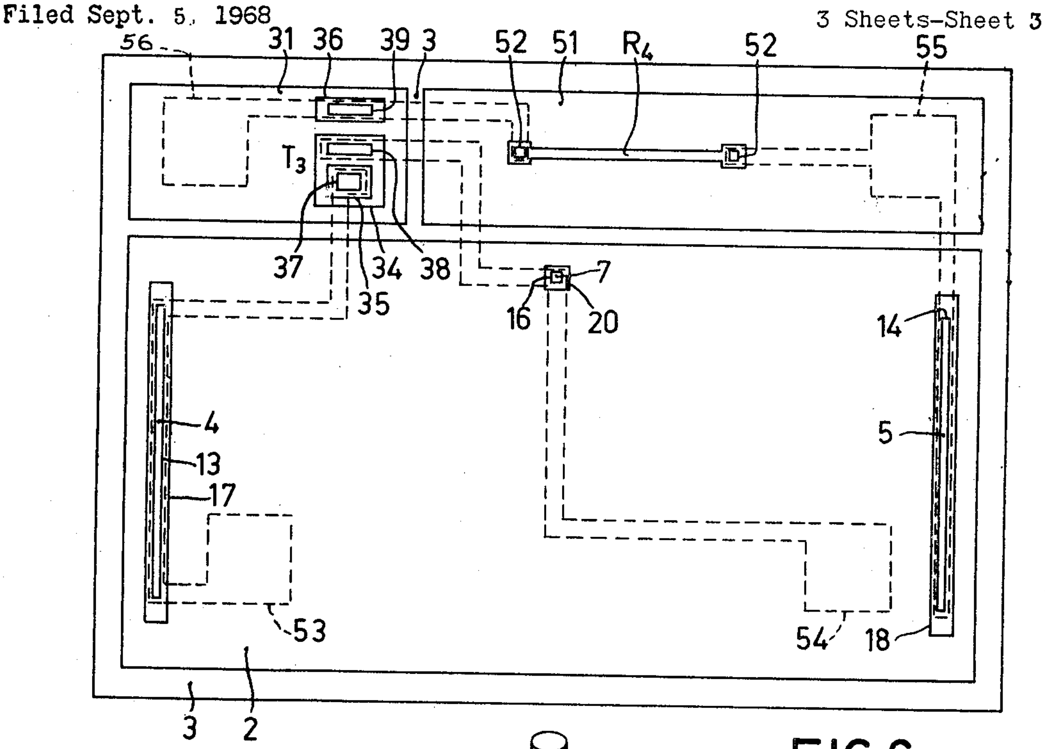

FIG. 6 is a plan view of an embodiment of a Hall element according to the invention, in which the epitaxial silicon layer forms parts of two further circuit elements, namely of the transistor $T_3$ and the resistor $R_4$.

Like in the preceding examples, an insulating layer of, for example, silicon oxide is provided on the epitaxial layer and is assumed to be transparent so that the underlying regions are visible. Conductors on the insulating layer are shown in broken lines.

The epitaxial layer is divided in the n-type islands 2, 31 and 51 by the p-type regions 3.

The epitaxial layer consisting of the island 2, 31 and 51 and the regions 3 is provided on a p-type silicon substrate. The epitaxial layer and the substrate correspond, as regards the thickness and doping, to the epitaxial layers and substrates of the preceding examples.

The island 2 is the semiconductor body of the Hall element which further is substantially entirely similar to that of the preceding examples (which is why the same reference numerals are used). The only difference is that in the present example the semiconductor body 2 of the Hall element has only one connection contact 7 for deriving electric Hall signals.

The transistor $T_3$ corresponds to the transistor $T_1$ of the preceding example, and for these transistors $T_3$ and $T_1$ the same reference numerals are used.

The resistor $R_4$ consists of a diffused p-type region which may be provided simultaneously with the base region 34. The length and width of the region may be chosen in connection with the desired value of the resistor $R_4$. The conductors denoted by broken lines contact the region $R_4$ through the apertures 52.

Connection conductors may be connected in a conventional manner to the parts 53, 54, 55 and 56 of the conductors.

The device shown in FIG. 6 also may be manufactured entirely by using methods which are conventional in the technology of manufacturing monolithic circuits.

Figure 7:
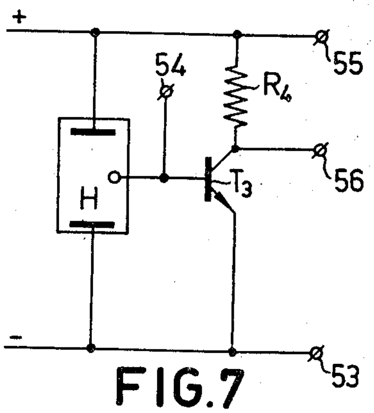
FIG. 7 is the circuit diagram.

The circuit diagram of the monolithic silicon circuit shown in FIG. 6 is shown in FIG. 7. The further circuit elements $T_3$ and $R_4$ form with their mutual electric connection a simple circuit for amplifying electric signals, the amplification of which can be controlled by means of the Hall signals to be produced. The Hall voltage determines the direct current component of the collector and hence the steepness and thus the gain factor of the transistor.

In order to restrict the current consumption it may be desirable that the semiconductor body of the Hall element is thinner than the epitaxial layer which is available. In that case a buried layer of the opposite conductivity type which adjoins the substrate may be provided in the epitaxial layer while the semiconductor body of the Hall element extends at least for the greater part above said buried layer.

Buried layers are frequently used in monolithic silicon circuits and are obtained by diffusing an impurity in a thin surface layer of the silicon substrate and then providing the epitaxial silicon layer in which during providing the epitaxial layer and/or afterwards, by a thermal treatment, the buried layer is obtained in the epitaxial layer by diffusion of the impurity.

In the example shown in FIGS. 1 and 2, a p-type buried layer may extend, for example, from the substrate 1, to the broken line 80, the n-type semiconductor body of the Hall element being provided between said line and the insulating layer 8.

Of course it is alternatively possible that the epitaxial layer comprises a diffused surface region of the opposite conductivity type, the semiconductor body of the Hall element being located at least for the greater part between said surface region and the substrate. The surface region may entirely overlap the island 2, the surface region comprising recesses in which the regions 17, 18, 19 and 20 are provided.

Figure 8:
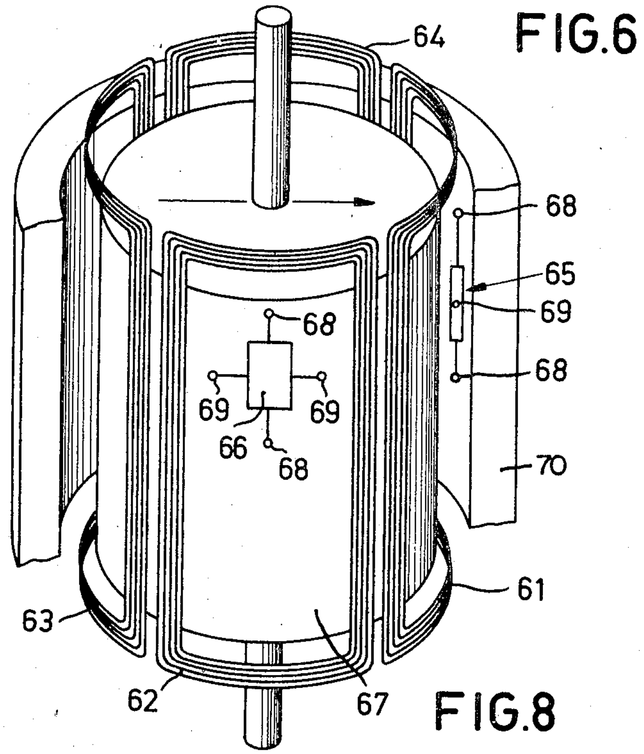
FIG. 8 is a diagrammatic perspective view of a brushless electric motor provided with Hall elements according to the invention.

FIG. 8 diagrammatically shows the principle of an electric motor, in this case a direct current motor, in which the current through the coils 61, 62, 63 and 64 is switched by means of the Hall elements 65 and 66 by the magnetic field of the rotor 67. The arrow denotes the direction of the magnetic field of the rotor. The coils 61, 64 are surrounded by a stack of laminations 70.

The operation of such a known type of motor is as follows. Via the input electrodes 68 a current is conveyed through the Hall elements 65 and 66. All signals may be derived from the electrodes 69.

In the position shown of the rotor, the magnetic field is at right angles to the Hall element 65, so that in this element all signals are produced which are derived from its electrodes 69 and which are applied to an amplifier and/or a switch, preferably an electronic switch, and in which the switch switches the current through the coil 62 and the said coil 62 produces a magnetic field. As a result of the magnetic field of the coil 62 and the rotor 67, the rotor 67 will rotate a quarter turn.

Hall signals are then produced in the Hall element 66 which switch the current through the coil 63 in a similar manner and as a result of which the rotor 67 rotates a quarter turn further.

The Hall element 69 now again supplies Hall signals which switch the current through the coil 64 as a result of which the rotor 67 again rotates a quarter turn and the Hall element 66 produces Hall signals which switch a current through the coil 61 so that the rotor 67 again rotates a quarter turn, and so on.

In order to avoid complexity of FIG. 8 and because amplifiers for electric signals and electronic switches are universally shown, the amplifiers and switches are not known in FIG. 8.

The invention is of very great importance for the type of electric motors described and the invention therefore comprises an electric motor of the type described in which Hall elements 65 and 66 according to the invention are used. Actually, Hall elements according to the invention may be manufactured cheaply and very accurately by means of conventional planar methods. The invention is of particular importance for these motors because a Hall element according to the invention together with an amplifier element and an electronic switch may constitute a monolithic silicon circuit. As is known amplifier circuits and electronic switches may be constructed as monolithic silicon circuits, while, as already described, a Hall element according to the invention may comprise further circuit elements, and then constitutes a monolithic circuit.

It will be obvious that the invention is not restricted to the examples described and that many variations are possible to those skilled in the art without departing from the scope of this invention. For example, a Hall element according to the invention may comprise a larger number of circuit elements than is the case in the examples described, while in addition circuit elements other than those mentioned, for example, capacitances and M.I.S. transistors may be present. Particularly the thickness and doping of the substrate which only serves as a support, may deviate strongly from the thickness and doping for the examples described.

What is claimed is:

1. A semiconductor device comprising a semiconductor body substrate of single crystal silicon having on a surface portion thereof an epitaxial silicon layer of one type conductivity whose thickness is small relative to that of the substrate, said substrate being of the opposite type conductivity forming a p-n junction with the epitaxial layer, said epitaxial layer containing at least one annular region of the opposite type conductivity extending from the surface of the layer to the substrate forming a boundary p-n junction which with the p-n junction at the substrate interface defines in the epitaxial layer at least one island of one type conductivity constituting a Hall element, an insulating layer on the epitaxial layer surface and having therein over the island first and second spaced openings and at least a third opening located transversely to an imaginary line between the first and second openings, and conductors on said insulating layer extending through the openings into contact with the one type island, said contacts through the first and second openings serving to convey a current through the Hall element, said contact through the third opening serving to derive an electral Hall signal generated when current is conveyed through the Hall element and it is subjected to a magnetic field.

2. A device as set forth in claim 1 wherein the substrate has a resistivity of the order of 2 ohm-cm., and the epitaxial layer has a resistivity of the order of 0.5 ohm-cm.

3. A device as set forth in claim 1 wherein the epitaxial layer comprises a surface region of the opposite conductivity type, the Hall element lying mainly between the substrate and the opposite type surface region.

4. A device as set forth in claim 1 wherein a buried layer of the opposite conductivity type adjoining the substrate is provided in the epitaxial layer, the Hall element lying mainly above the buried layer.

5. A semiconductor device comprising a semiconductor body substrate of single crystal silicon having on a surface portion thereof an epitaxial silicon layer of one type conductivity whose thickness is small relative to that of the substrate, said substrate being of the opposite type conductivity forming a p-n junction with the epitaxial layer, said epitaxial layer containing at least two annular regions of the opposite type conductivity extending from the surface of the layer to the substrate forming boundary p-n junctions which with the p-n junction at the substrate interface defines in the epitaxial layer at least two islands of one type conductivity of which one constitutes a Hall element, an insulating layer on the epitaxial layer surface and over the boundary p-n junctions and having therein over the Hall element island first and second spaced elongated openings and at least a third opening located transversely to an imaginary line between the first and second openings, conductors on said insulating layer extending through the openings into contact with the Hall element island, said contacts through the first and second openings serving to convey a current through the Hall element, said contact through the third opening serving to derive an electral Hall signal generated when current is conveyed through the Hall element and it is subjected to a magnetic field, a transistor amplifier incorporated in the other island, said insulating layer having openings over the transistor amplifier in the other island, conductors on the insulating layer and passing through the openings into contact with the transistor amplifier input and output, interconnections on the insulating layer connecting the contact through the third opening which derives the Hall signal to the conductor connected to the amplifier input, and means connected to the amplifier output for deriving an amplified Hall signal.

6. A device as set forth in claim 5 wherein the Hall element includes diffused regions of one type conductivity but of higher conductivity than the epitaxial layer underlying the contacts.

7. A device as set forth in claim 6 wherein the Hall element has two contacts for deriving the Hall signal, the amplifier includes at least two transistors, and each of the two contacts is coupled to an input of one of the two transistors.

8. A device as set forth in claim 5 wherein the Hall element has one contact for deriving the Hall signal, and means coupling said one contact to the amplifier input such that the amplification of the amplifier is controlled by the level of the derived Hall signal.

References Cited

UNITED STATES PATENTS

| | | | |
|---|---|---|---|
| 3,202,913 | 8/1965 | Marinace | 324—45 |
| 3,246,214 | 4/1966 | Hugle | 317—235 |
| 3,293,457 | 12/1966 | Rytaro-Mori et al. | 310—10 |
| 3,305,790 | 2/1967 | Parsons et al. | 330—6 |

DAVID X. SLINEY, Primary Examiner

U.S. Cl. X.R.

310—10